United States Patent
Koyanagi (10) Patent No.: US 9,345,125 B2
(45) Date of Patent: May 17, 2016

(54) WIRING SUBSTRATE

(71) Applicant: SHINKO ELECTRIC INDUSTRIES CO., LTD., Nagano-ken (JP)

(72) Inventor: Takaaki Koyanagi, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/567,230

(22) Filed: Dec. 11, 2014

(65) Prior Publication Data

US 2015/0201484 A1 Jul. 16, 2015

(30) Foreign Application Priority Data

Jan. 10, 2014 (JP) .................. 2014-003529

(51) Int. Cl.
| | |
|---|---|
| H05K 1/16 | (2006.01) |
| H05K 1/00 | (2006.01) |
| H05K 7/00 | (2006.01) |
| H05K 1/18 | (2006.01) |
| H05K 1/02 | (2006.01) |
| H05K 1/11 | (2006.01) |

(52) U.S. Cl.
CPC ................ H05K 1/021 (2013.01); H05K 1/114 (2013.01); H05K 1/183 (2013.01); *H05K 2201/10015* (2013.01)

(58) Field of Classification Search
USPC .......................... 174/252, 260; 361/760, 761
See application file for complete search history.

(56) References Cited

U.S. PATENT DOCUMENTS

| | | | | |
|---|---|---|---|---|
| 7,583,512 | B2 * | 9/2009 | Ryu ...................... | H05K 1/185 174/260 |
| 8,314,343 | B2 * | 11/2012 | Inoue ..................... | H01L 24/24 174/255 |
| 2008/0163486 | A1 * | 7/2008 | Imamura ................ | H05K 1/184 29/832 |
| 2009/0205202 | A1 * | 8/2009 | Tanaka ................... | H01L 24/18 29/834 |
| 2012/0063108 | A1 * | 3/2012 | Kim ...................... | H05K 1/0231 361/783 |

FOREIGN PATENT DOCUMENTS

| | | |
|---|---|---|
| JP | 2013-084692 | 5/2013 |
| JP | 2013084692 A * | 5/2013 |

* cited by examiner

*Primary Examiner* — Sherman Ng
(74) *Attorney, Agent, or Firm* — Fish & Richardson P.C.

(57) ABSTRACT

A wiring substrate includes a core substrate. The core substrate includes an accommodation hole extending through the core substrate from. A first wiring layer is formed on a first surface of the core substrate. A second wiring layer is formed on a second surface of the core substrate located opposite to the first surface. An electronic component, which includes a connection terminal, is accommodated in the accommodation hole. A conductive film is formed on a wall surface of the accommodation hole at a location corresponding to the connection terminal of the electronic component. The conductive film is connected to at least one of the first wiring layer and the second wiring layer. A thermal conductor thermally connects the connection terminal of the electronic component and the conductive film.

9 Claims, 8 Drawing Sheets

WIRING SUBSTRATE

CROSS-REFERENCE TO RELATED APPLICATIONS

This application is based upon and claims the benefit of priority from prior Japanese Patent Application No. 2014-003529, filed on Jan. 10, 2014, the entire contents of which are incorporated herein by reference.

FIELD

This disclosure relates to a wiring substrate and a method for manufacturing a wiring substrate.

BACKGROUND

Japanese Laid-Open Patent Publication No. 2013-84692 describes a wiring substrate incorporating an electronic component such as a chip type capacitor element (chip capacitor). The wiring substrate includes a core substrate, and the core substrate includes an accommodation hole (cavity) that accommodates the electronic component. The wiring substrate includes a wiring pattern and a via (via wire) to electrically connect the electronic component to a semiconductor chip that is mounted on the wiring substrate.

SUMMARY

Electronic components, such as a semiconductor chip and a capacitor element, generate heat when activated. The heat generated by an electronic component may lower the performance of the electronic component or cause a defect. Thus, there is a need to dissipate heat from electronic components incorporated in a wiring substrate.

One aspect of this disclosure is a wiring substrate including a core substrate. The core substrate includes a first surface, a second surface located opposite to the first surface, and an accommodation hole extending through the core substrate from the first surface to the second surface. A first wiring layer is formed on the first surface of the core substrate. A second wiring layer is formed on the second surface of the core substrate. An electronic component is accommodated in the accommodation hole. The electronic component includes a connection terminal. A conductive film is formed on a wall surface of the accommodation hole at a location corresponding to the connection terminal of the electronic component. The conductive film is connected to at least one of the first wiring layer and the second wiring layer. A thermal conductor thermally connects the connection terminal of the electronic component and the conductive film.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

One embodiment will now be described with reference to the drawings. In the drawings, elements are illustrated for simplicity and clarity and have not necessarily been drawn to scale. To facilitate understanding, hatching lines may not be illustrated in the cross-sectional drawings.

Figure 1A:
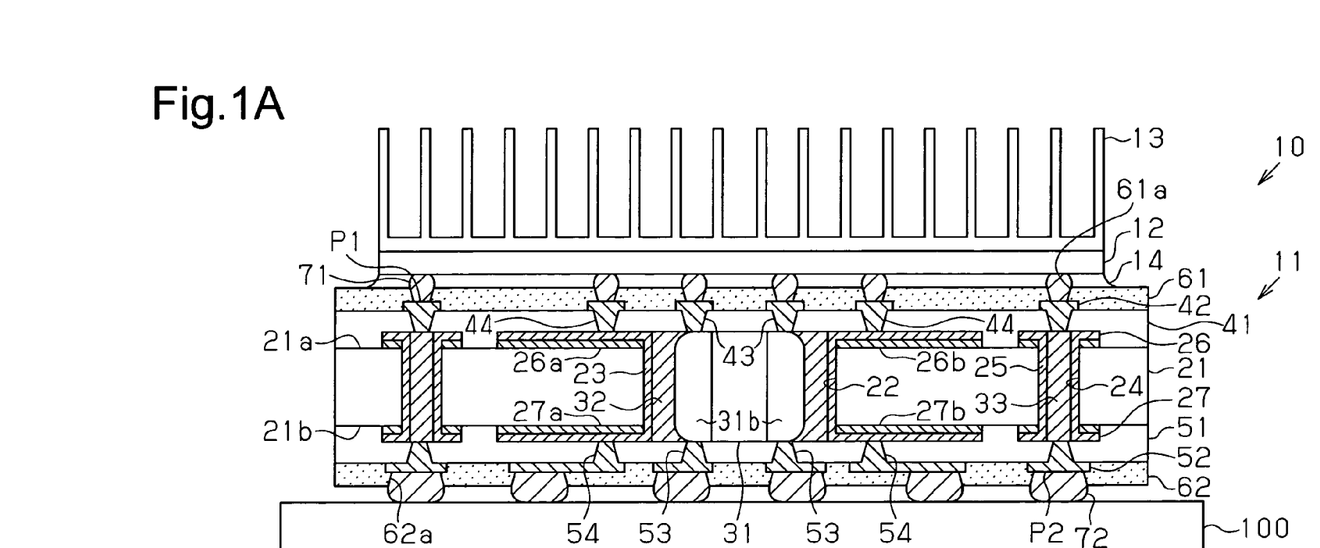
FIG. 1A is a schematic cross-sectional view of a semiconductor device including a wiring substrate.

As illustrated in FIG. 1A, a semiconductor device 10 is mounted on a substrate 100 such as a motherboard. The semiconductor device 10 includes a wiring substrate 11, a semiconductor element 12, which is mounted on the wiring substrate 11, and a heat sink 13 (heat dissipator), which is arranged on the semiconductor element 12.

The wiring substrate 11 includes a core substrate 21. The core substrate 21 is, for example, a glass epoxy substrate. The glass epoxy substrate is formed by impregnating, for example, a glass cloth (glass woven fabric), which is a reinforcement material, with a thermosetting insulative resin and hardening the resin. The main component of the thermosetting insulative resin is an epoxy resin. The reinforcement material is not limited to glass cloth. For example, a glass non-woven fabric, an aramid woven fabric, an aramid non-woven fabric, a liquid crystal polymer (LCP) woven fabric, or an LCP non-woven fabric may be used as the reinforcement material. The thermosetting insulative resin is not limited to epoxy resin. For example, a polyimide resin or a cyanate resin may be used as the thermosetting insulative resin.

Figure 1B:
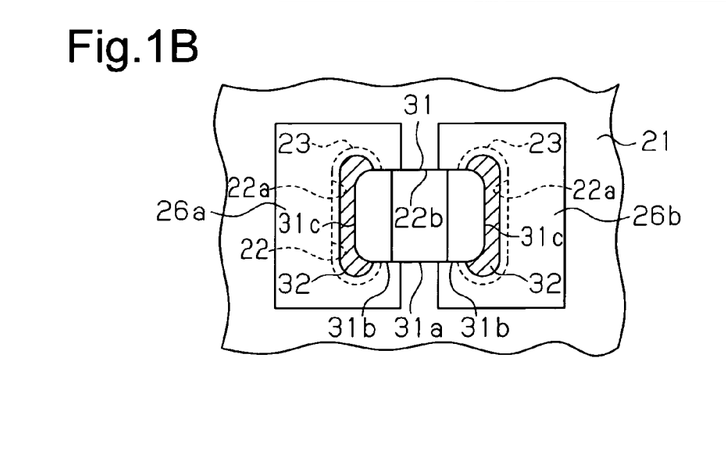
FIG. 1B is a schematic plan view of an electronic component mounted on the wiring substrate.

The core substrate 21 includes an upper surface 21a and a lower surface 21b. A cavity 22 extends through the core substrate 21 from the upper surface 21a to the lower surface 21b. The cavity 22 serves as an accommodation hole that accommodates a chip capacitor 31 (electronic component). The chip capacitor 31 is, for example, a ceramic chip capacitor. As illustrated in FIG. 1B, the chip capacitor 31 includes a main body 31a and two connection terminals 31b, which are connected to two ends of the main body 31a. The chip capacitor 31 is generally box-shaped. The chip capacitor 31 has, for example, a length (L) of 0.6 mm, a width (W) of 0.3 mm, and a thickness (T) of 0.1 mm.

Figure 1C:
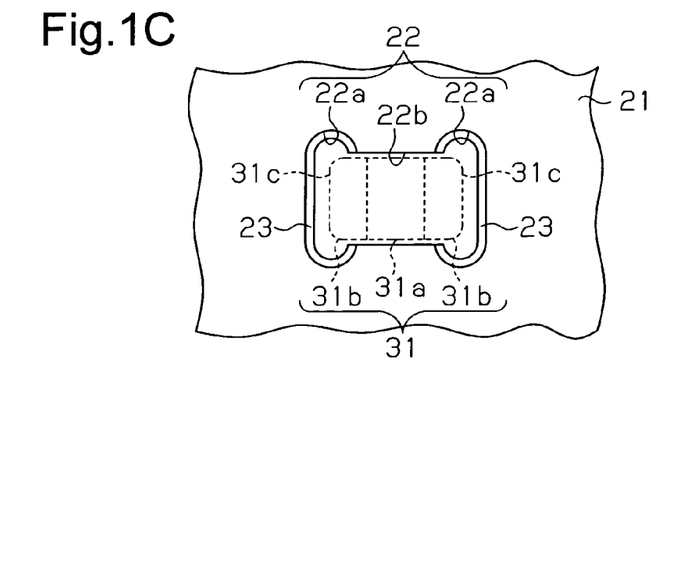
FIG. 1C is a schematic plan view of a cavity that accommodates the electronic component.

As illustrated in FIG. 1C, the cavity 22 includes two first cavities 22a, which correspond to the two connection terminals 31b of the chip capacitor 31, and a second cavity 22b, which communicates the two first cavities 22a to each other. In FIG. 1C, to clarify the shape of the cavity 22, the chip capacitor 31 is illustrated in broken lines and reduced in size as compared with the other drawings. In the present embodiment, each first cavity 22a serves as a first accommodation hole, and the second cavity 22b serves as a second accommodation hole.

When the core substrate 21 is viewed from above, the two first cavities 22a are located at the two ends of the cavity 22 in a first direction in which the two connection terminals 31b of the chip capacitor 31 are opposed to each other (e.g., longitudinal direction of chip capacitor 31). Each first cavity 22a extends in a second direction that is orthogonal to the first direction. In other words, the chip capacitor 31 includes two end surfaces 31c located on the two connection terminals 31b and extending in the second direction. Thus, the two first cavities 22a extend along and parallel to the two end surfaces 31c. Each first cavity 22a includes two semicircular ends and is oblong as a whole. Further, as viewed from above, each first cavity 22a surrounds the corresponding connection terminal 31b, that is, the corresponding end surface 31c of the chip capacitor 31. A gap (clearance) exists between the wall surface of each first cavity 22a and the corresponding end surface 31c of the chip capacitor 31. The gap is set in accordance with a mounter that holds the chip capacitor 31 and is, for example, 30 to 50 μm.

The second cavity 22b communicates the two first cavities 22a to each other. The second cavity 22b includes two wall surfaces opposed to each other. The distance between the two wall surfaces, that is, the width of the second cavity 22b is set in accordance with the width of the chip capacitor 31.

The wall surface of each first cavity 22a is covered by a conductive film 23. The material of the conductive film 23 is, for example, copper. Each wall surface of the second cavity 22b is not covered by a conductive film. Accordingly, the inner wall of the core substrate 21 is exposed in the second cavity 22b. A gap (clearance) exists between each wall surface of the second cavity 22b and the main body 31a of the chip capacitor 31. This gap is smaller than the gap described above between the wall surface of each first cavity 22a and the corresponding end surface 31c of the chip capacitor 31.

As illustrated in FIG. 1B, the first cavity 22a is filled with a conductor 32. The conductor 32 is formed by hardening a conductive paste, which is, for example, a solder paste or a copper paste. The conductor 32 is formed from a material having high thermal conductivity, and the thermal conductivity of the conductor 32 is higher than the thermal conductivity of the insulative material used for the core substrate 21 and insulation layers 41 and 51, which will be described later. The conductor 32 is one example of a thermal conductor. The conductive paste may be, for example, a conductive resin formed by adding a conductive material, such as metal grains of copper or aluminum, to a resin such as an epoxy resin, a polyimide resin, or a silicone resin. Although not illustrated in the drawings, the gap between each wall surface of the second cavity 22b and the main body 31a of the chip capacitor 31 is filled with an insulative material.

As illustrated in FIG. 1A, the core substrate 21 includes a plurality of (two in FIG. 1A) through holes 24 extending through the core substrate 21 from the upper surface 21a to the lower surface 21b. A through conductor 25 is formed in each through hole 24. The through conductor 25 is shaped in conformance with the wall surface of the through hole 24 and is, for example, tubular. The material of the through conductor 25 is, for example, copper (Cu). The through conductor 25 is filled with a conductor 33. The conductor 33 is formed by hardening a conductive paste. The conductor 33 in the through conductor 25 is formed from, for example, the same material as the conductor 32 in each first cavity 22a.

A wiring layer 26 (first wiring layer) is formed on the upper surface 21a of the core substrate 21. For example, the wiring layer 26 includes a copper foil, which is formed on the upper surface 21a, and copper plating, which is formed on the copper foil. In the same manner, a wiring layer 27 (second wiring layer) is formed on the lower surface 21b of the core substrate 21. For example, the wiring layer 27 includes a copper foil, which is formed on the lower surface 21b, and copper plating, which is formed on the copper foil. The wiring layers 26 and 27 are electrically connected to the through conductors 25 and the conductors 33.

Each of the wiring layers 26 and 27 includes a plurality of electrically disconnected isolation wires. Each isolation wire is electrically connected to one of the conductive films 23 in the cavity 22. In the present embodiment, as illustrated in FIG. 1B, the wiring layer 26 includes wires 26a and 26b that serve as the isolation wires. The wire 26a is electrically connected to the conductive film 23 in one of the first cavities 22a, and the wire 26b is electrically connected to the conductive film 23 in the other one of the first cavities 22a. The wires 26a and 26b are electrically disconnected. In the same manner, the wiring layer 27 includes wires 27a and 27b that serve as the isolation wires. Although not illustrated in FIG. 1B, the wires 27a and 27b are also electrically disconnected from each other.

The wires 26a and 26b and the wires 27a and 27b may be formed as planar wires on the upper surface 21a and the lower surface 21b of the core substrate 21. Planar wires are preferred from the aspect of heat dissipation. Further, planar wires that form the wires 26a, 26b, 27a, and 27b may be used as a power plane or a ground plane.

The insulation layer 41 (first insulation layer) and a wiring layer 42 (third wiring layer) are stacked in this order on the upper surface 21a of the core substrate 21. In the same manner, the insulation layer 51 (second insulation layer) and a wiring layer 52 (fourth wiring layer) are stacked in this order on the lower surface 21b of the core substrate 21. The material of the insulation layers 41 and 51 is, for example, an insulative resin such as an epoxy resin or a polyimide resin. The material of the wiring layers 42 and 52 is, for example, copper.

The wiring layer 42 includes wiring patterns formed on vias 43 and 44 (via wires) extending through the insulation layer 41. In the present embodiment, the wiring layer 42 includes wires that are electrically connected to the two connection terminals 31b of the chip capacitor 31 by the vias 43. Further, the wiring layer 42 includes wires that are electrically connected to the wiring layer 26 (wires 26a, 26b, etc.) on the upper surface 21a of the core substrate 21 by the vias 44. The wiring layer 42 also includes wires that are electrically connected to the conductors 33 in the through conductors 25.

In the same manner, the wiring layer 52 includes wiring patterns formed on vias 53 and 54 (via wires) extending through the insulation layer 51. In the present embodiment, the wiring layer 52 includes wires that are electrically connected to the two connection terminals 31b of the chip capacitor 31 by the vias 53. Further, the wiring layer 52 includes wires that are electrically connected to the wiring layer 27 (wires 27a, 27b, etc.) on the lower surface 21b of the core substrate 21 by the vias 54 and wires that are electrically connected to the conductors 33 in the through conductors 25.

The insulation layer 41 and the wiring layer 42 are covered by a resist film 61. The material of the resist film 61 is, for example, an insulative resin such as an epoxy resin or an acrylic resin. The resist film 61 includes openings 61a that expose portions of the wiring layer 42 as connection pads P1 (first connection pads). A connection terminal 71 is arranged on each connection pad P1. The connection terminal 71 is, for example, a solder ball. The connection terminal 71 is connected to a pad (not illustrated) of the semiconductor element 12. The space between the semiconductor element 12 and the wiring substrate 11 (resist film 61) is filled with an underfill resin 14.

In the same manner, the insulation layer 51 and the wiring layer 52 are covered by a resist film 62. The material of the resist film 62 is, for example, an insulative resin such as an epoxy resin or an acrylic resin. The resist film 62 includes openings 62a that expose portions of the wiring layer 52 as external connection pads P2 (second connection pads). An external connection terminal 72 is arranged on each external connection pad P2. The external connection terminal 72 is, for example, a solder ball. The external connection terminal 72 is connected to a pad (not illustrated) of a substrate 100.

A heat sink 13 is arranged on the upper surface of the semiconductor element 12. The heat sink 13 includes a flat base and heat dissipation fins, which project toward the upper side from the upper surface of the base. The material of the heat sink 13 may be, for example, aluminum (Al) or an alloy of copper and aluminum. A bonding member (not illustrated) bonds the heat sink 13 to the upper surface of the semiconductor element 12 (surface opposite to element formation surface). The material of the bonding member may be, for example, a silicon polymer resin or an epoxy resin.

The operation of the semiconductor device 10 will now be described.

The heat sink 13, which is fixed to the semiconductor element 12, dissipates the heat generated from the semiconductor element 12. The heat generated from the semiconductor element 12 is transmitted to the substrate 100 through the connection terminals 71, the wiring layer 42, conductive materials such as the vias 43, and the connection terminals 72.

The vias 53 connect the connection terminals 31b of the chip capacitor 31 to the wiring layer 52. The wiring layer 52 is connected by the connection terminals 72 to the substrate 100. Accordingly, heat is transmitted from the chip capacitor 31 to the substrate 100 through the connection terminals 31b, the vias 53, the wiring layer 52, and the connection terminals 72.

The conductive films 23 are formed on the wall surfaces of the two first cavities 22a. The conductive films 23 are electrically connected to the wiring layer 26 (wires 26a and 26b) on the upper surface 21a of the core substrate 21 and the wiring layer 27 (wires 27a and 27b) on the lower surface 21b of the core substrate 21. Each first cavity 22a is filled with the conductor 32. Accordingly, the conductive film 23 and the conductor 32 connect the two connection terminals 31b of the chip capacitor 31 to the wiring layers 26 and 27 (wires 26a, 26b, 27a, and 27b). Conductive materials such as the vias 54, the wiring layer 52, and the connection terminals 72 connect the wiring layers 26 and 27 to the substrate 100. In each connection terminal 31b, the area of the conductor 32 that contacts the connection terminal 31b is larger than the area of the via 53 that contacts the connection terminal 31b. Accordingly, the heat of the chip capacitor 31 is transmitted to the wiring layers 26 and 27 by the conductor 32, which has a larger contact area than the via 53, and the conductive film 23. In other words, the conductor 32 thermally connects the connection terminal 31b of the chip capacitor 31 and the conductive film 23. The heat transmitted to the wiring layer 27 is further transmitted by the connection terminals 72 to the substrate 100.

In a conventional wiring substrate, a cavity that accommodates the chip capacitor 31 is filled with an insulative resin. Such an insulative resin has low thermal conductivity. Thus, the heat of the chip capacitor 31 is transmitted to substantially only the vias that are connected to the chip capacitor.

In the present embodiment, the conductor 32 in each first cavity 22a has higher thermal conductivity than an insulative resin. Accordingly, in addition to the via 53 connected to each connection terminal 31b of the chip capacitor 31, the heat of the chip capacitor 31 is transmitted to the wiring layers 26 and 27 by the conductor 32 in each first cavity 22a. The heat transmitted to the wiring layer 27 is further transmitted to the substrate 100 through the wiring layer 52, the conductive material of the vias 54 and the like, and the connection terminals 72. Accordingly, in the wiring substrate 11 of the present embodiment, more heat is dissipated from the chip capacitor 31 than the conventional wiring substrate in which a cavity is filled with only insulative resin.

A method for manufacturing the wiring substrate 11 and the semiconductor device 10 will now be described. Each drawing includes only the reference characters used to describe each manufacturing step.

Figure 2:
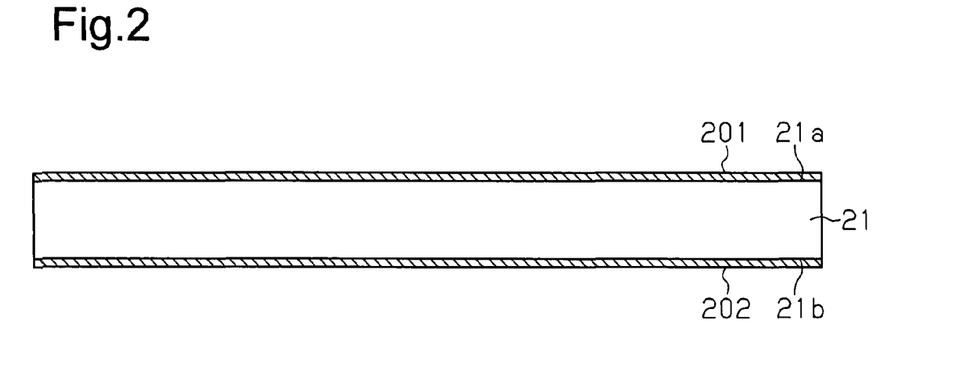
FIGS. 2, 3A, 3B, 4A, 4B, 5A, 5B, 6A, 6B, 7A, 7B, 8A, 8B, and 9 to 14 are schematic diagrams illustrating manufacturing steps of the wiring substrate.

Referring to FIG. 2, the core substrate 21 is first prepared. A conductive layer 201 is applied to the upper surface 21a of the core substrate 21, and a conductive layer 202 is applied to the lower surface 21b of the core substrate 21. The conductive layers 201 and 202 are, for example, formed from copper (Cu) and may be copper foils or the like.

Figure 3A:
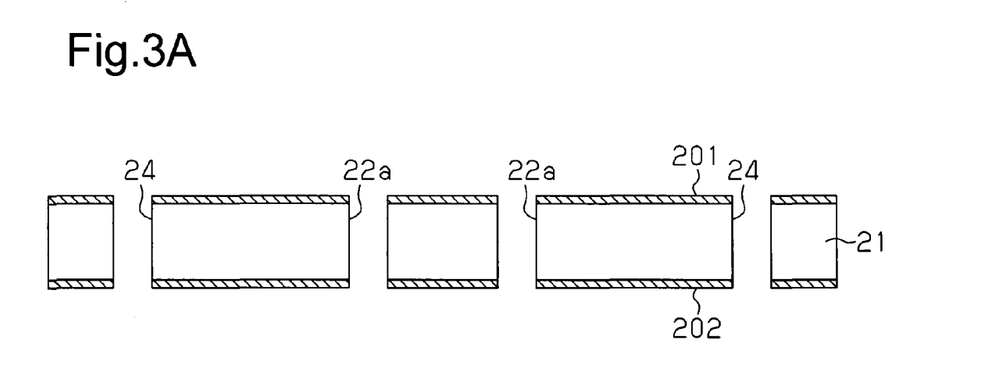
Figure 3B:
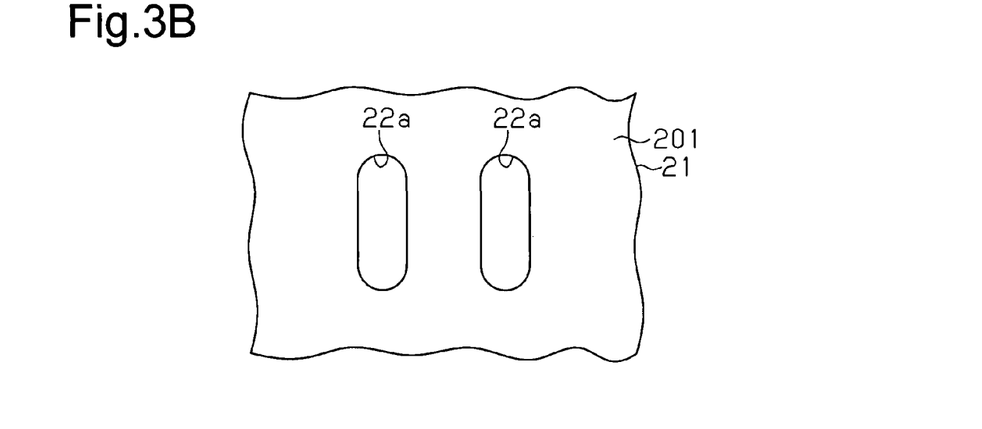

Referring to FIG. 3A, through holes are formed in the core substrate 21. The through holes include a plurality of (here, two) first cavities 22a and a plurality of (here, two) through holes 24. Referring to FIG. 3B, each first cavity 22a includes two arcuate ends as viewed from above. The first cavities 22a may be formed by, for example, a router or a laser processor. The through holes 24 may be formed by, for example, a laser processor or a boring machine.

Figure 4A:
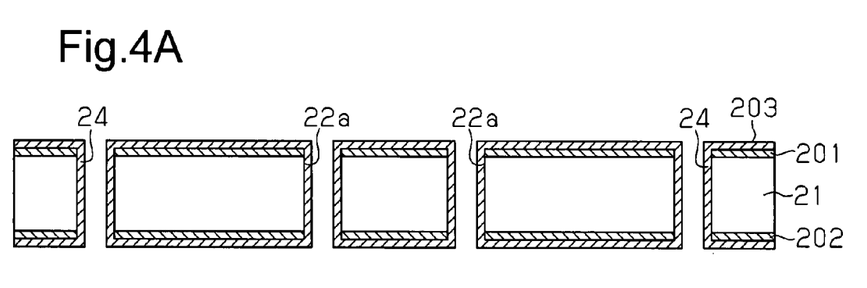
Figure 4B:
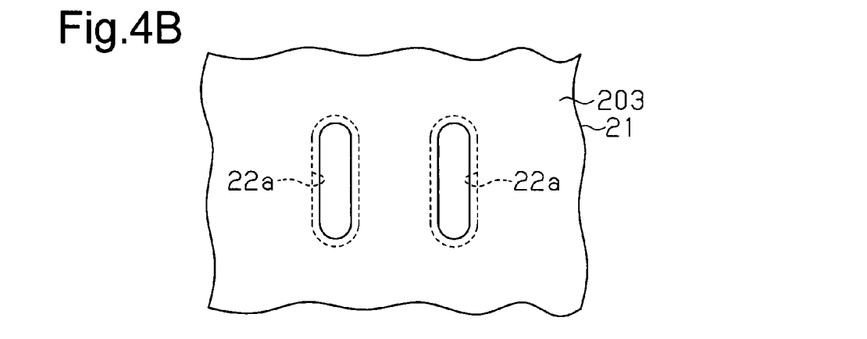

Referring to FIGS. 4A and 4B, a conductive layer 203 is applied to the surface of the structure illustrated in FIG. 3A, which has undergone a desmearing process. The conductive layer 203 is formed by performing, for example, electroless copper plating. Electrolytic copper plating may be performed after electroless copper plating to form the conductive layer 203. The conductive layer 203 is used to form the conductive films 23 and the through conductors 25.

Figure 5A:
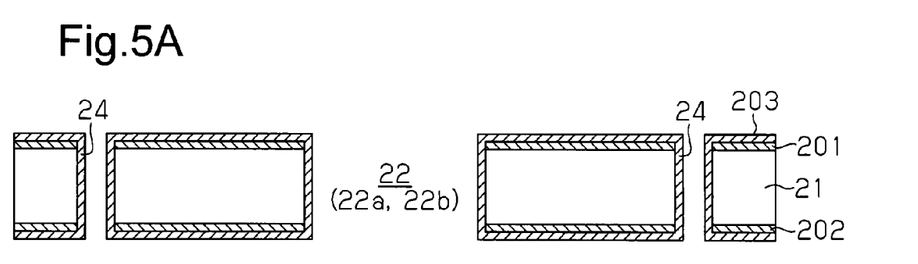
Figure 5B:
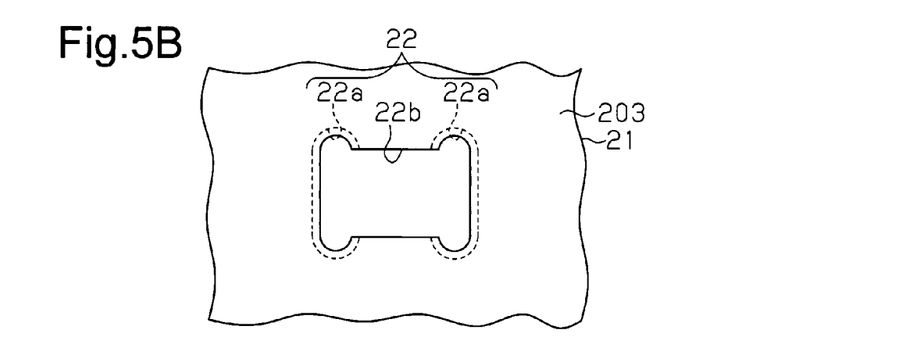

Referring to FIGS. 5A and 5B, the second cavity 22b is formed in the core substrate 21. The second cavity 22b may be formed by a press, a router, or a laser processor. As illustrated in FIG. 5B, the formation of the second cavity 22b forms the cavity 22, which includes the second cavity 22b and the first cavities 22a.

Figure 6A:
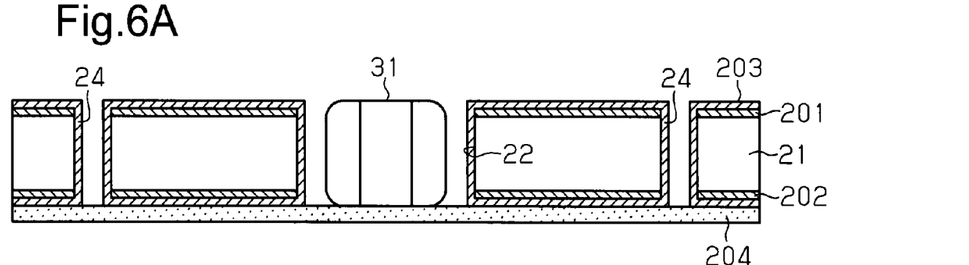
Figure 6B:
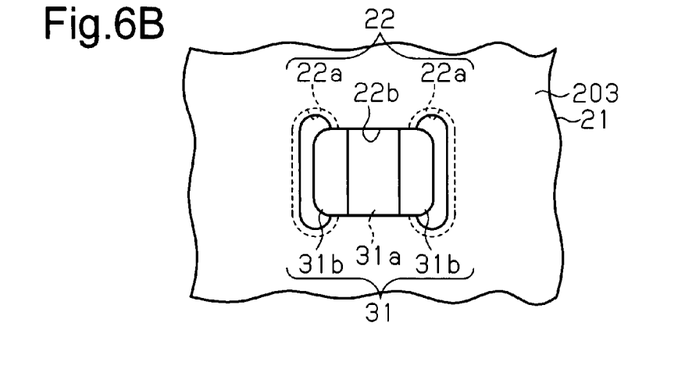

Referring to FIG. 6A, a cover film 204, which includes an adhesive, is adhered to one surface (here, lower surface 21b) of the core substrate 21. As illustrated in FIGS. 6A and 6B, the chip capacitor 31 is accommodated in the cavity 22 and mounted on the cover film 204.

Figure 7A:
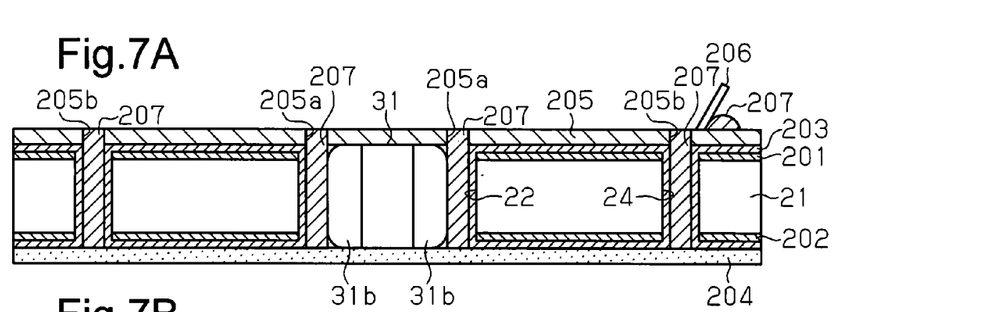
Figure 7B:
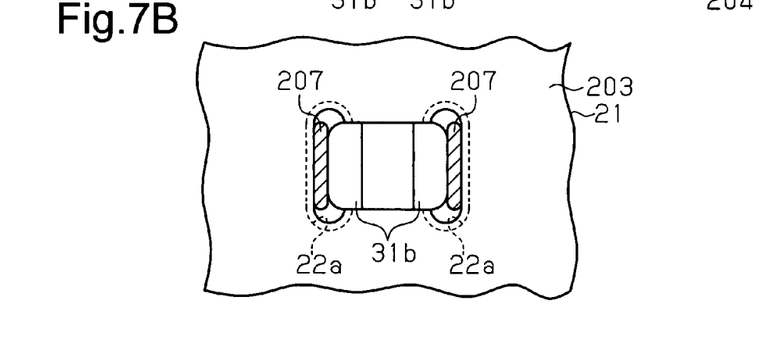

Referring to FIG. 7A, screen printing is performed with a stencil mask 205 and a squeegee 206 to fill internal gaps of the structure illustrated in FIG. 6A with conductive paste 207. The stencil mask 205 includes openings 205a, which correspond to gaps between the chip capacitor 31 and the first cavities 22a, and openings 205b, which correspond to the through holes 24. Accordingly, as illustrated in FIG. 7B, each through hole 24 and each first cavity 22a is filled with the conductive paste 207. The application of the conductive paste 207 is performed under, for example, a depressurized condition (e.g., vacuum atmosphere). In this manner, the through holes 24 and the first cavities 22a are simultaneously filled with the conductive paste 207. This allows the number of manufacturing steps to be reduced and the time used for manufacturing to be shortened as compared to when filling the through holes 24 and the first cavities 22a with the conductive paste 207 in different steps.

Figure 8A:
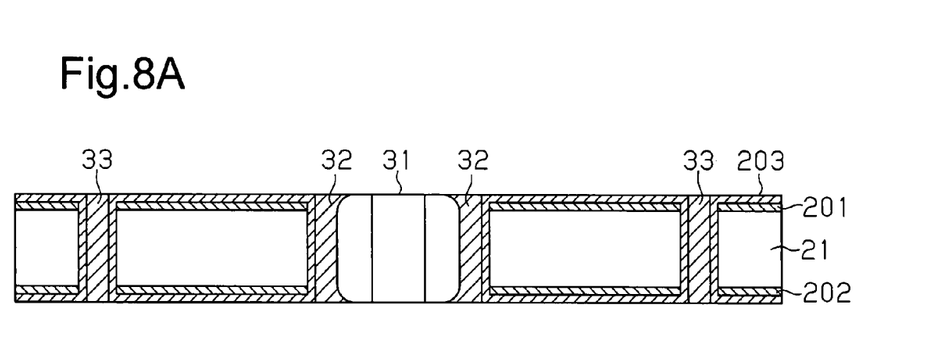
Figure 8B:
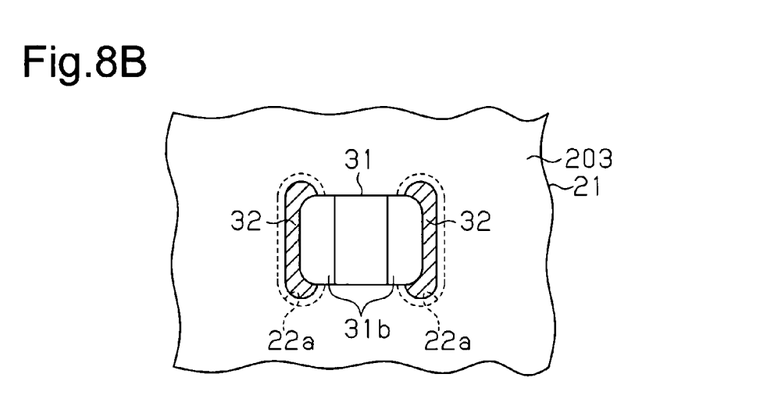

Referring to FIG. 8A, the conductors 32 and 33 are formed, and the cover film 204 is removed from the core substrate 21. For example, after melting the conductive paste 207 in a reflow process, the molten conductive paste 207 is hardened to form the conductors 32 and 33. Consequently, as illustrated in FIG. 8B, the conductive paste 207 in each first cavity 22a forms the conductor 32. Here, the gap between each wall surface of the second cavity 22b and the chip capacitor 31 is smaller than the gap between the wall surface of each first cavity 22a and the chip capacitor 31. Further, the wall surface of each first cavity 22a is covered by the conductive film 23. Accordingly, the molten conductive paste 207 enters the gap between each connection terminal 31b of the chip capacitor 31 and the conductive film 23 of the corresponding first cavity 22a but does not enter the gap between the wall surface of the second cavity 22b and the chip capacitor 31. Thus, even when the cavity 22 is filled with the conductive paste 207, the conductors 32, which are formed by hardening the conductive paste 207, are prevented from short-circuiting the two connection terminals 31b of the chip capacitor 31.

Figure 9:
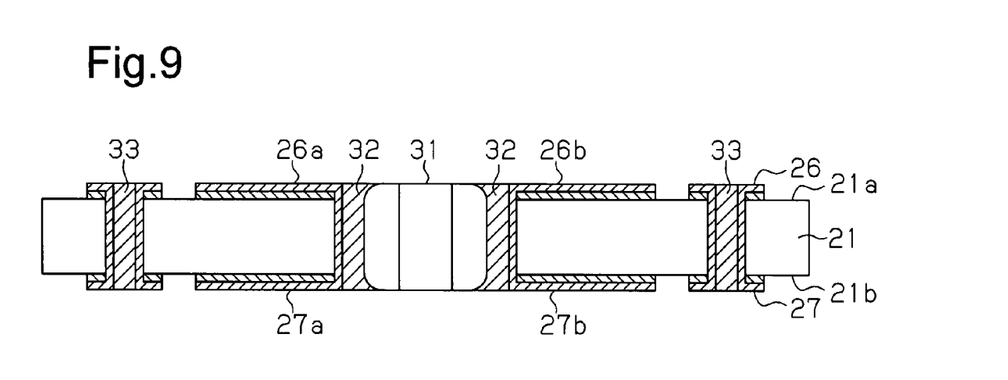

Referring to FIG. 9, the wiring layers 26 and 27 are formed. The conductive layers 201, 202, and 203 illustrated in FIG. 8A are patterned by performing etching or the like to form the wiring layers 26 and 27.

Figure 10:
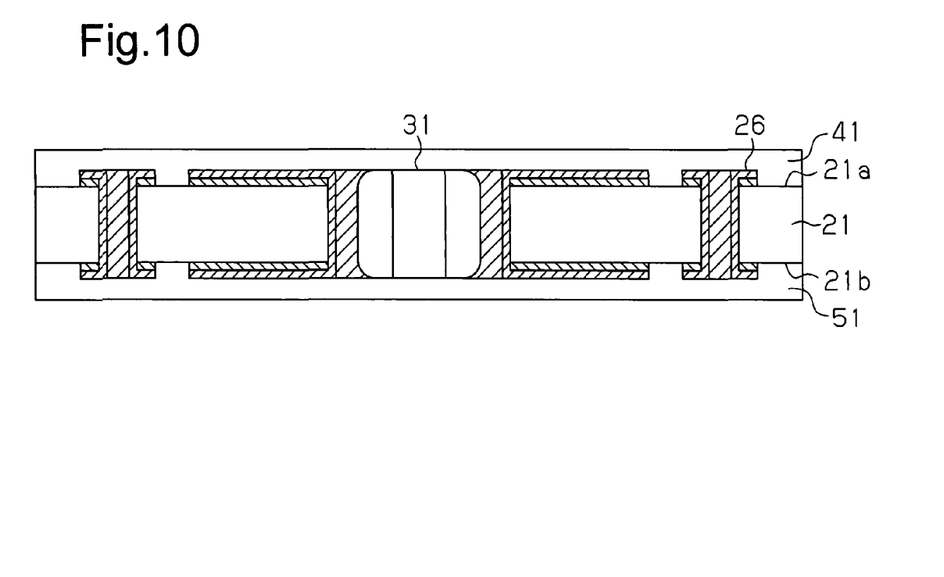

Referring to FIG. 10, the insulation layers 41 and 51 are formed covering the surfaces of the structure illustrated in FIG. 9 (i.e., exposed surfaces of core substrate 21, wiring layers 26 and 27, chip capacitor 31, and conductors 32 and 33). For example, the upper surface and the lower surface of the structure illustrated in FIG. 9 are each covered by a resin film. The material of the resin film is, for example, a thermosetting resin such as an epoxy resin or a polyimide resin. For example, a resin film in a B-stage (semi-hardened) is applied to the two surfaces of the core substrate 21. Then, the two surfaces of the core substrate 21 are heated and pressurized with a pressing machine or the like under a depressurized atmosphere to harden the resin. This forms the insulation layers 41 and 51.

Figure 11:
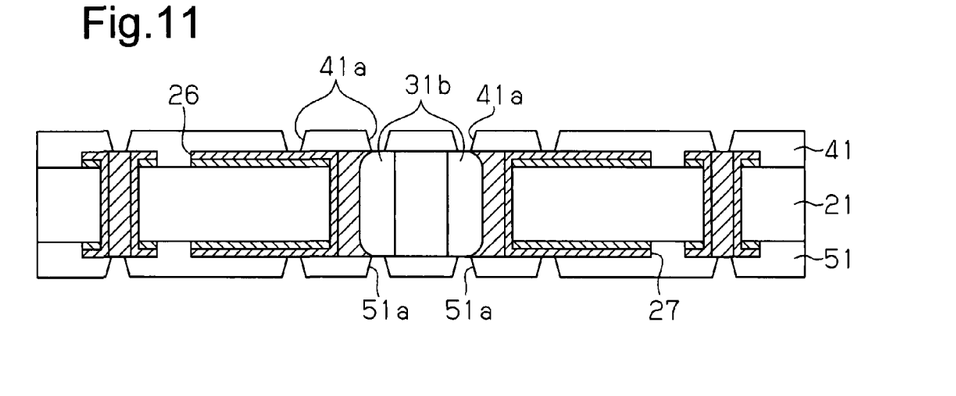

Referring to FIG. 11, openings 41a and 51a are formed in the insulation layers 41 and 51 to expose a portion of the surface of each connection terminal 31b of the chip capacitor 31 and portions of the surface of each of the wiring layers 26 and 27. The openings 41a and 51a may be formed by using, for example, a laser processor.

Figure 12:
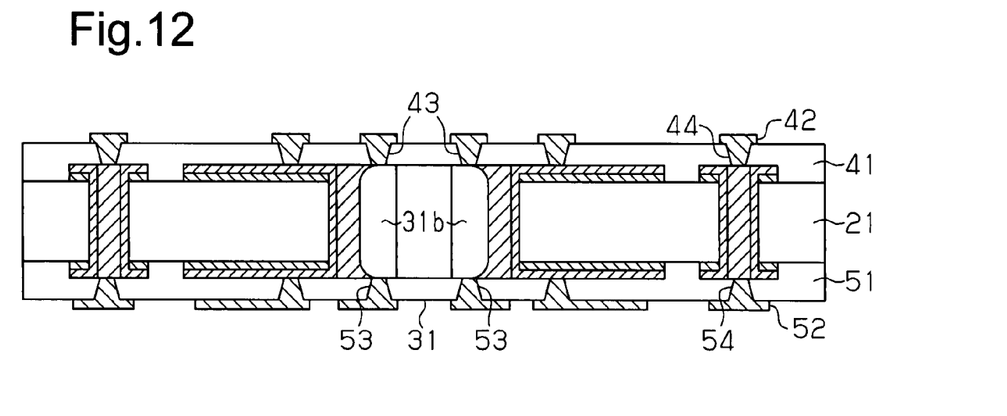

Referring to FIG. 12, the vias 43, 44, 53, and 54 and the wiring layers 42 and 52 are formed. The vias 43, 44, 53, and 54 and the wiring layers 42 and 52 are formed by performing, for example, a semi-additive process.

Figure 13:
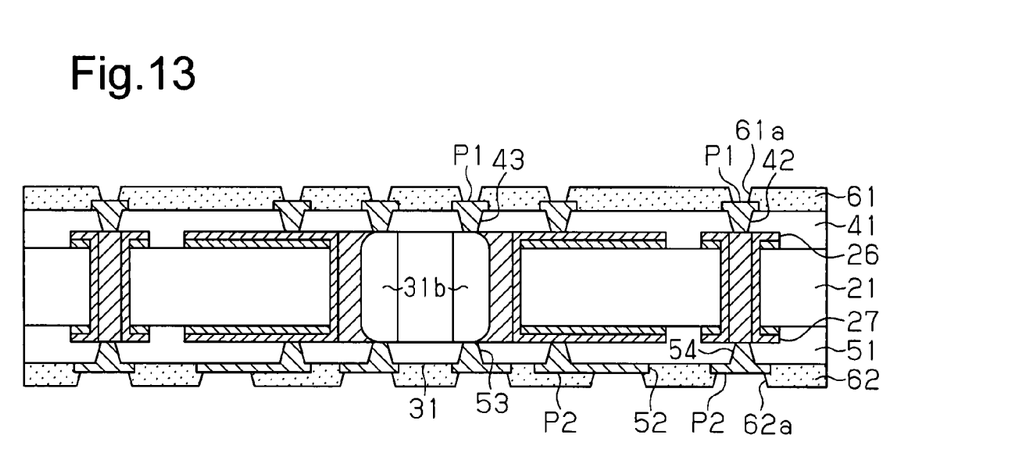

Referring to FIG. 13, the resist films 61 and 62 are formed. The resist films 61 and 62 are formed by covering the insulation layers 41 and 51 and the wiring layers 42 and 52 with, for example, a photosensitive resin film of epoxy resin and hardening the photosensitive resin film. Then, the resist films 61 and 62 are patterned to form openings 61a and 62a. This exposes portions of the wiring layer 42 as the connection pads P1 and exposes portions of the wiring layer 52 as the connection pads P2.

Figure 14:
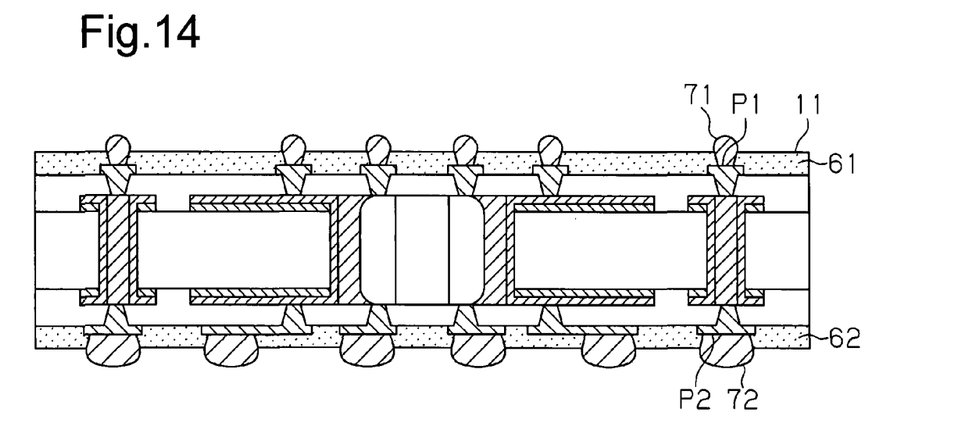

Referring to FIG. 14, solder paste is applied to the surfaces of the connection pads P1 and P2. Then, for example, a reflow process is performed under a temperature of 240° C. to 260° C. to form the connection terminals 71 and 72.

Figure 15:
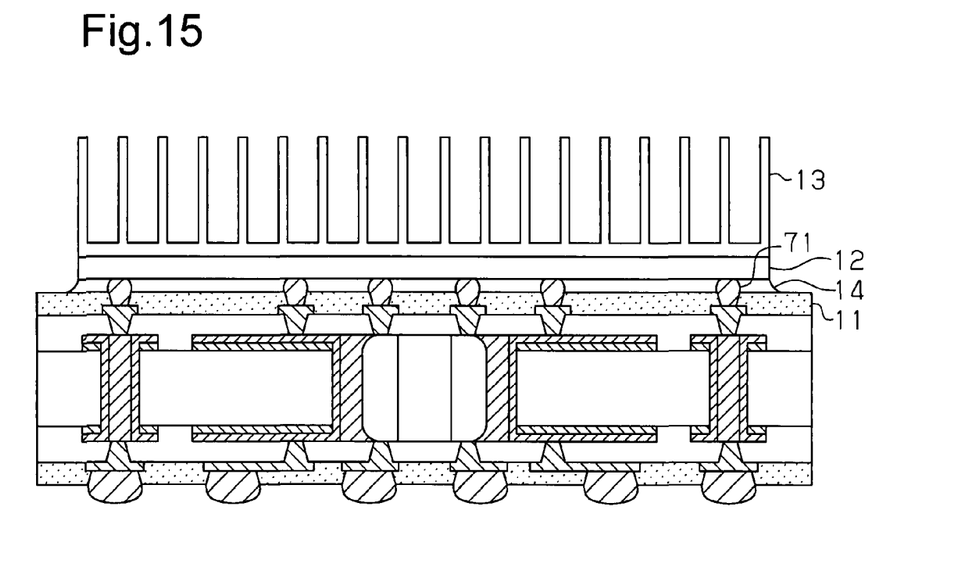
FIG. 15 is a schematic diagram illustrating a manufacturing step of the semiconductor device.

Referring to FIG. 15, the semiconductor element 12 is flip-chip-bonded to the connection terminals 17. Then, the space between the semiconductor element 12 and the wiring substrate 11 is filled with the underfill resin 14. Further, the heat sink 13 is fixed to the upper surface of the semiconductor element 12.

The present embodiment has the advantages described below.

(1) The core substrate 21 of the wiring substrate 11 includes the cavity 22 that extends through the core substrate 21 from the upper surface 21a to the lower surface 21b. The cavity 22 includes the plurality of (two in the present example) first cavities 22a and the second cavity 22b, which communicates the first cavities 22a with each other. The conductive film 23 is formed on the wall surface of each first cavity 22a. The cavity 22 accommodates the chip capacitor 31. Each first cavity 22a is filled with the conductor 32. The conductor 32 is located between each connection terminal 31b of the chip capacitor 31 and the corresponding conductive film 23 to electrically and thermally connect the connection terminal 31b and the conductive film 23. The conductors 32 and the conductive films 23 connect the connection terminals 31b of the chip capacitor 31 and the wiring layers 26 and 27 (wires 26a, 26b, 27a, and 27b) of the core substrate 21. The wiring layer 52, conductive material such as the vias 53, and the connection terminals 72 connect the wiring layer 27 to the substrate 100. In each connection terminal 31b, the area of the conductor 32 that contacts the connection terminal 31b is larger than the area of the via 53 that contacts the connection terminal 31b. Accordingly, the heat of the chip capacitor 31 is transmitted to the wiring layers 26 and 27 by the conductor 32, which has a larger contact area than the via 53, and the conductive film 23. The heat is also transmitted from the wiring layer 27 via the connection terminals 72 to the substrate 100.

The conductor 32 in each first cavity 22a has higher thermal conductivity than an insulative resin. Accordingly, in addition to the via 53 connected to each connection terminal 31b of the chip capacitor 31, the heat of the chip capacitor 31 is transmitted to the wiring layers 26 and 27 by the conductor 32 in each first cavity 22a. The heat transmitted to the wiring layer 27 is further transmitted to the substrate 100 through the wiring layer 52, the conductive material of the vias 54 and the like, and the connection terminals 72. Accordingly, in the wiring substrate 11 of the present embodiment, more heat is dissipated from the chip capacitor 31 than the conventional wiring substrate in which a cavity is filled with only insulative resin.

(2) The cavity 22 that accommodates the chip capacitor 31 includes the two first cavities 22a, which correspond to the two connection terminals 31b of the chip capacitor 31, and the second cavity 22b, which communicates the two first cavities 22a with each other. The width of the second cavity 22b, that is, the distance between the two wall surfaces of the second cavity 22b, is set in conformance with the width of the chip capacitor 31. Accordingly, even when the cavity 22 is filled with the conductive paste 207 for the conductors 32, the conductive paste 207 enters the gap between each connection terminal 31b of the chip capacitor 31 and the conductive film 23 of each first cavity 22a but does not enter the gap between the wall surface of the second cavity 22b and the chip capacitor 31. This prevents the conductors 32, which are formed by hardening the conductive paste 207, from short-circuiting the two connection terminals 31b of the chip capacitor 31.

(3) The wall surface of each first cavity 22a is covered by the conductive film 23. The material of the conductive film 23 is, for example, copper. The wall surface of the second cavity 22b is not covered by a conductive film. Accordingly, the core substrate 21 is exposed in the second cavity 22b. The connection terminals 31b of the chip capacitor 31 and the conductive films 23 in the first cavity 22a have satisfactory wettability with respect to the conductive paste 207. In contrast, the wall surface of the second cavity 22b defined by the inner wall of the core substrate does not have satisfactory wettability. Accordingly, when the cavity 22 is filled with the conductive paste 207 for the conductor 32 and the conductive paste 207 is melted and hardened, the conductive paste 207 remains in the gap between each connection terminal 31b of the chip capacitor 31 and the conductive film 23 of each first cavity 22a. The conductive paste 207 does not enter the gap between the wall surface of the second cavity 22b and the chip capacitor 31. As a result, the conductor 32 is formed in a preferred manner in only the gap between each connection terminal 31b of the chip capacitor 31 and the conductive film 23 of each first cavity 22a. This prevents the conductors 32, which are formed by hardening the conductive paste 207, from short-circuiting the two connection terminals 31b of the chip capacitor 31.

(4) When manufacturing the wiring substrate 11, the two first cavities 22a are formed in the core substrate 21, and the conductive layer 203 is formed on the wall surface of each first cavity 22a. Then, the second cavity 22b, which communicates the two first cavities 22a, is formed. The cavity 22 that accommodates the chip capacitor 31 in formed in this manner. This manufacturing method easily forms the cavity 22 that includes the conductive film 23 in only the first cavity 22a, which corresponds to each connection terminal 31b of the chip capacitor 31, and does not include a conductive film in the second cavity 22b, which corresponds to the main body 31a of the chip capacitor 31.

It should be apparent to those skilled in the art that the present invention may be embodied in many other specific forms without departing from the spirit or scope of the invention. Particularly, it should be understood that the present invention may be embodied in the following forms.

The conductors 32 do not have to be connected to both of the wiring layer 26 (first wiring layer) and the wiring layer 27 (second wiring layer) and only need to be connected to at least one of the wiring layers 26 and 27.

A material having high thermal conductivity is used as the conductor 32. However, other material can be used instead. For example, the conductor 32 serving as a thermal conductor may be a thermally conductive material formed by mixing a filler of an inorganic material having high thermal conductivity (e.g., silica, alumina, boron nitride, or the like) to an insulative resin such as a polyimide resin, an epoxy resin, or a silicone resin. In this case, instead of the filler of an organic material, a filler of a metal material may be used such as gold (Au), silver (Ag), copper (Cu), aluminum (Al), nickel (Ni), chromium (Cr), or cobalt (Co). Alternatively, a filler formed by coating the surface of a metal material with an insulative material (e.g., resin material) may be used. Alternatively, a filler formed from an insulative inorganic material may be used. In any case, the thermal conductivity of each of these thermally conductive materials is higher than the thermal conductivity of the insulation material used for the core substrate 21 and the insulation layers 41 and 51.

To prevent expansion of the substrate, it is preferred that the material used for the conductor 32 be such that only a small amount of gas (out gas) is generated when heated. Further, to reduce warping of the wiring substrate 11 caused by volume changes, it is preferred that the material of the conductor 32 have, for example, a coefficient of thermal expansion (CTE) close to that of the core substrate 21. A material that resists decomposition in a high-temperature range and/or superior heat resistance may be used as the conductor 32. Further, a material that resists stress may be used as the conductor 32.

An electronic component such as a resistor element, an inductor element, or a semiconductor element (LSI) may be accommodated in the cavity 22 of the core substrate 21 in lieu of the chip capacitor 31.

The chip capacitor 31 accommodated in the cavity 22 includes two connection terminals 31b. Instead, an electronic component including three or more connection terminals may be accommodated in the cavity 22. In this case, the cavity 22 would include three first cavities 22a.

The material of the conductor 33 in the through conductor 25 may differ from the material of the conductor 32 in the first cavity 22a. For example, the conductor 33 may be metal plating such as copper plating.

The through conductors 25 may be filled with an insulative resin. In this case, in FIG. 1A, the vias 44 and 54 are connected to the wiring layers 26 and 27.

The shape of the cavity serving as the accommodation hole may be changed as long as the conductive film 23 is formed on the wall surface of the cavity facing each connection terminal 31b of the chip capacitor 31, and the conductive film 23 is not formed on the wall surface of the cavity facing the main body 31a of the chip capacitor 31. For example, the cavity may be tetragonal as viewed from above.

The wiring substrate 11 of FIG. 1A illustrates only one example of the number of wiring layers and the number of insulation layers stacked on the upper surface 21a of the core substrate 21. The number of wiring layers and the number of insulation layers may be changed. In the same manner, the number of wiring layers and the number of insulation layers stacked on the lower surface 21b of the core substrate 21 may be changed.

Clauses

This disclosure further encompasses various embodiments described below.

1. A method for manufacturing a wiring substrate, the method including:

preparing a core substrate including a first surface and a second surface opposite to the first surface;

forming a plurality of through holes extending through the core substrate from the first surface to the second surface, wherein the plurality of through holes includes a plurality of first cavities respectively accommodating a plurality of connection terminals of an electronic component;

forming a conductive film on a wall surface of each of the through holes;

forming a second cavity that communicates the first cavities so that the first cavities and the second cavity form an accommodation hole that accommodates the electronic component;

arranging the electronic component in the accommodation hole;

forming a thermal conductor in each first cavity between the corresponding connection terminal of the electronic component accommodated in the first cavity and the conductive film facing the corresponding connection terminal; and forming a wiring layer including a wire connected to the conductive film in each first cavity.

2. The method according to clause 1, further including:

forming an insulation layer that covers the wiring layer;

forming a plurality of via wires extending through the insulation layer and respectively connected to the connection terminals of the electronic component; and forming a wiring layer on the via wires, wherein the wiring layer is electrically connected to the connection terminals of the electronic component by the via wires.

The present examples and embodiments are to be considered as illustrative and not restrictive, and the invention is not to be limited to the details given herein, but may be modified within the scope and equivalence of the appended claims.

The invention claimed is:

1. A wiring substrate comprising:

a core substrate including a first surface, a second surface located opposite to the first surface, and an accommodation hole extending through the core substrate from the first surface to the second surface;

a first wiring layer formed on the first surface of the core substrate;

a second wiring layer formed on the second surface of the core substrate;

an electronic component accommodated in the accommodation hole, wherein the electronic component includes a connection terminal;
a conductive film formed on a wall surface of the accommodation hole at a location corresponding to the connection terminal of the electronic component, wherein the conductive film is connected to at least one of the first wiring layer and the second wiring layer;
a thermal conductor comprising at least in part a metallic conductor that thermally and electrically connects the connection terminal of the electronic component and the conductive film;
a first insulation layer formed on the first surface of the core substrate;
a second insulation layer formed on the second surface of the core substrate;
a first via wire extending through the first insulation layer; and
a second via wire extending through the second insulation layer,
wherein each of the first via wire and the second via wire is electrically and directly connected to the connection terminal of the electronic component,
the connection terminal of the electronic component is in contact with the thermal conductor, the first via wire, and the second via wire so that each of the thermal conductor, the first via wire, and the second via wire serves as an electric and heat conductive path, and
an area of the thermal conductor in contact with the connection terminal is larger than an area of the first via wire in contact with the connection terminal and an area of the second via wire in contact with the connection terminal.

2. The wiring substrate according to claim 1, wherein
the electronic component includes a main body and a plurality of connection terminals;
the accommodation hole includes
  a plurality of first accommodation holes respectively formed at locations corresponding to the connection terminals, wherein the conductive film is formed on a wall surface of each first accommodation hole, and
  a second accommodation hole formed at a location corresponding to the main body of the electronic component to communicates the first accommodation holes; and
a gap between the main body of the electronic component and a wall surface of the second accommodation hole facing the main body is smaller than a gap between the conductive film and the corresponding one of the connection terminals.

3. The wiring substrate according to claim 1, further comprising:

a third wiring layer formed on the first insulation layer and including a wire electrically connected to the connection terminal of the electronic component by the first via wire; and
a fourth wiring layer formed on the second insulation layer and including a wire electrically connected to the connection terminal of the electronic component by the second via wire.

4. The wiring substrate according to claim 1, wherein
the first insulation layer is formed on the first surface of the core substrate to cover the first surface of the core substrate, the first wiring layer, the electronic component, the conductive film, and the thermal conductor; and
the second insulation layer is formed on the second surface of the core substrate to cover the second surface of the core substrate, the second wiring layer, the electronic component, the conductive film, and the thermal conductor.

5. The wiring substrate according to claim 1, wherein the electronic component is a chip capacitor.

6. The wiring substrate according to claim 1, further comprising:
a first connection pad formed at a side of the first surface of the core substrate and used when mounting a second electronic component; and
a second connection pad formed at a side of the second surface of the core substrate,
wherein the connection terminal of the electronic component electrically connects the first connection pad and the second connection pad.

7. The wiring substrate according to claim 1, wherein the connection terminal of the electronic component has a height that is the same as a height of the thermal conductor in a thickness direction of the core substrate.

8. The wiring substrate according to claim 1, wherein:
each of the connection terminal of the electronic component and the thermal conductor includes a first end and a second end, which are exposed from the accommodation hole of the core substrate;
the first end of the connection terminal and the first end of the thermal conductor are flush with the first wiring layer; and
the second end of the connection terminal and the second end of the thermal conductor are flush with the second wiring layer.

9. The wiring substrate according to claim 1, wherein at least one of the first wiring layer and the second wiring layer comprises a planar wire.

* * * * *